United States Patent [19]

Grabbe

[11] 4,268,102

[45] May 19, 1981

[54] LOW IMPEDANCE ELECTRICAL CONNECTING MEANS FOR SPACED-APART CONDUCTORS

[75] Inventor: Dimitry G. Grabbe, Lisbon Falls, Me.

[73] Assignee: AMP Incorporated, Harrisburg, Pa.

[21] Appl. No.: 81,719

[22] Filed: Oct. 4, 1979

[51] Int. Cl.³ .............................................. H01R 9/09
[52] U.S. Cl. ............................ 339/75 M; 339/17 CF; 339/17 M; 339/92 M
[58] Field of Search ............. 339/17 CF, 17 M, 75 M, 339/92 M

[56] References Cited

U.S. PATENT DOCUMENTS

| | | | |
|---|---|---|---|
| 3,393,396 | 7/1968 | Majewski | 339/92 M |
| 3,871,736 | 3/1975 | Carter | 339/17 CF |
| 3,873,173 | 3/1975 | Anitalt | 339/17 CF |
| 3,993,384 | 11/1976 | Dennis et al. | 339/17 CF |
| 4,050,755 | 9/1977 | Hasircoglu | 339/17 CF |
| 4,052,118 | 10/1977 | Scheingold et al. | 339/17 CF |
| 4,176,895 | 12/1979 | Aldridge | 339/17 CF |
| 4,188,085 | 2/1980 | Aldridge et al. | 339/17 CF |

FOREIGN PATENT DOCUMENTS 2008333  5/1979  United Kingdom ........... 339/17 CF

OTHER PUBLICATIONS

"Plated Through Hole Contact", H. C. Schick; IBM Technical Disclosure Bulletin, vol. 6, No. 10, Mar. 1964.

*Primary Examiner*—John McQuade
*Attorney, Agent, or Firm*—Frederick W. Raring

[57] ABSTRACT

Multi-contact electrical connector for connecting a first plurality of conductors to a second plurality of conductors comprises an insulating housing having a plurality of side-by-side contact terminals therein, each terminal being a one-piece stamping having first and second contact portions for engagement with a first and second conductor respectively. The first and second contact portions also have first and second bypass contact surfaces thereon which are against each other. The spring means for maintaining contact force comprises a spring loop which extends circuitously from the first contact portion to the second contact portion. In use, the spring loop maintains the contact forces at all of the contact interfaces and the current flows from the first conductor through the first contact portion, through the bypass contact surfaces, through the second contact portion, and to the second conductor. The spring loop does not serve as a current path and self-inductance in the contact is thereby minimized.

8 Claims, 6 Drawing Figures

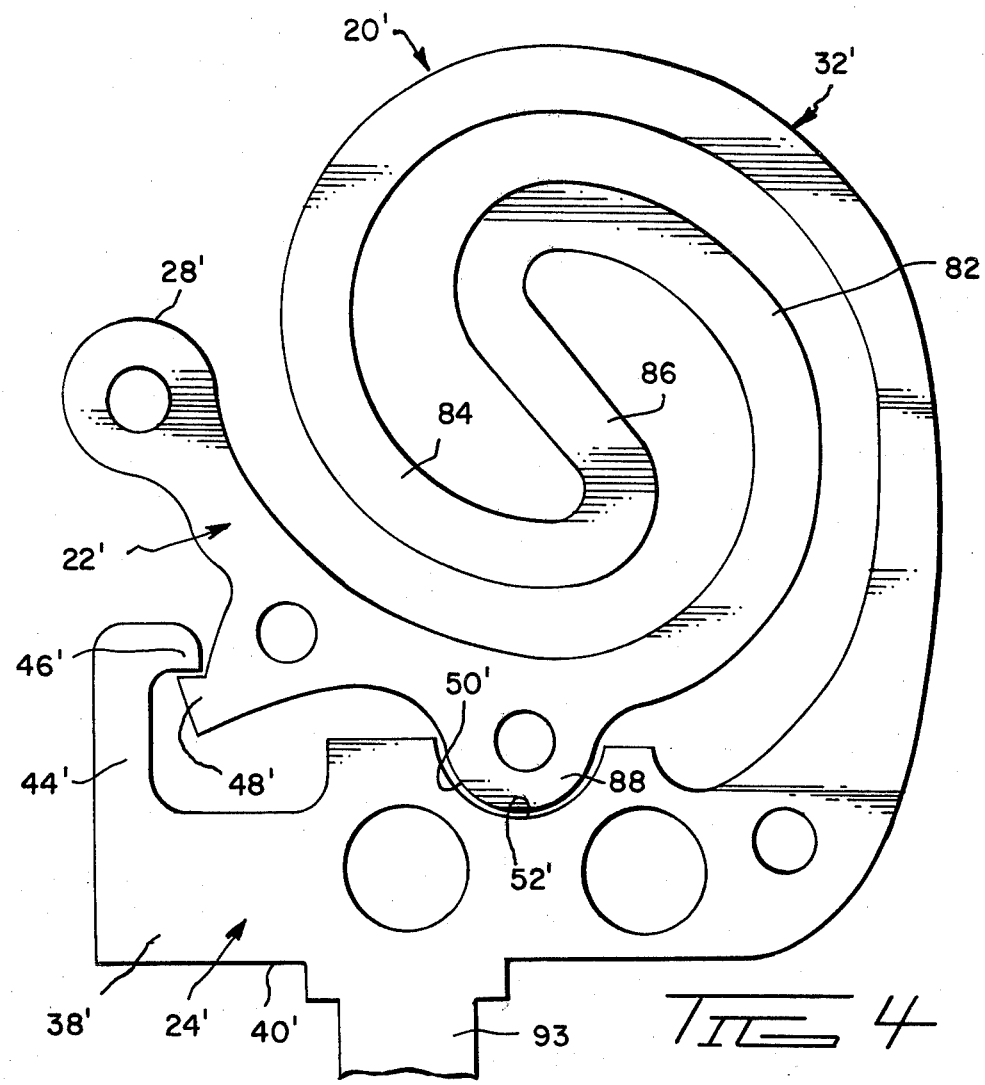
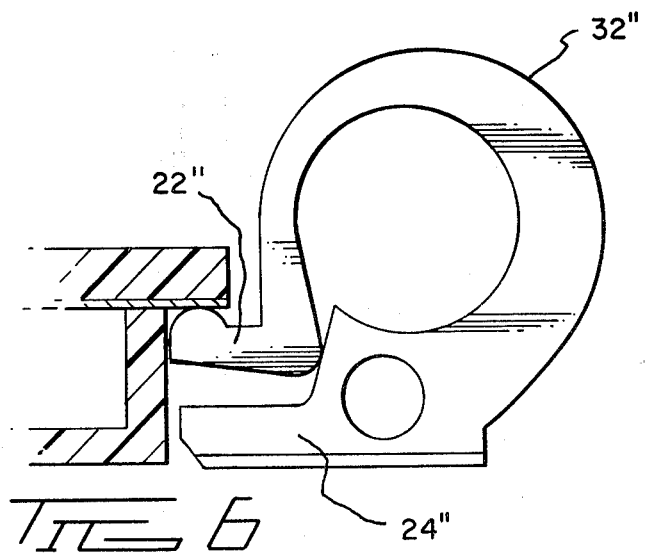

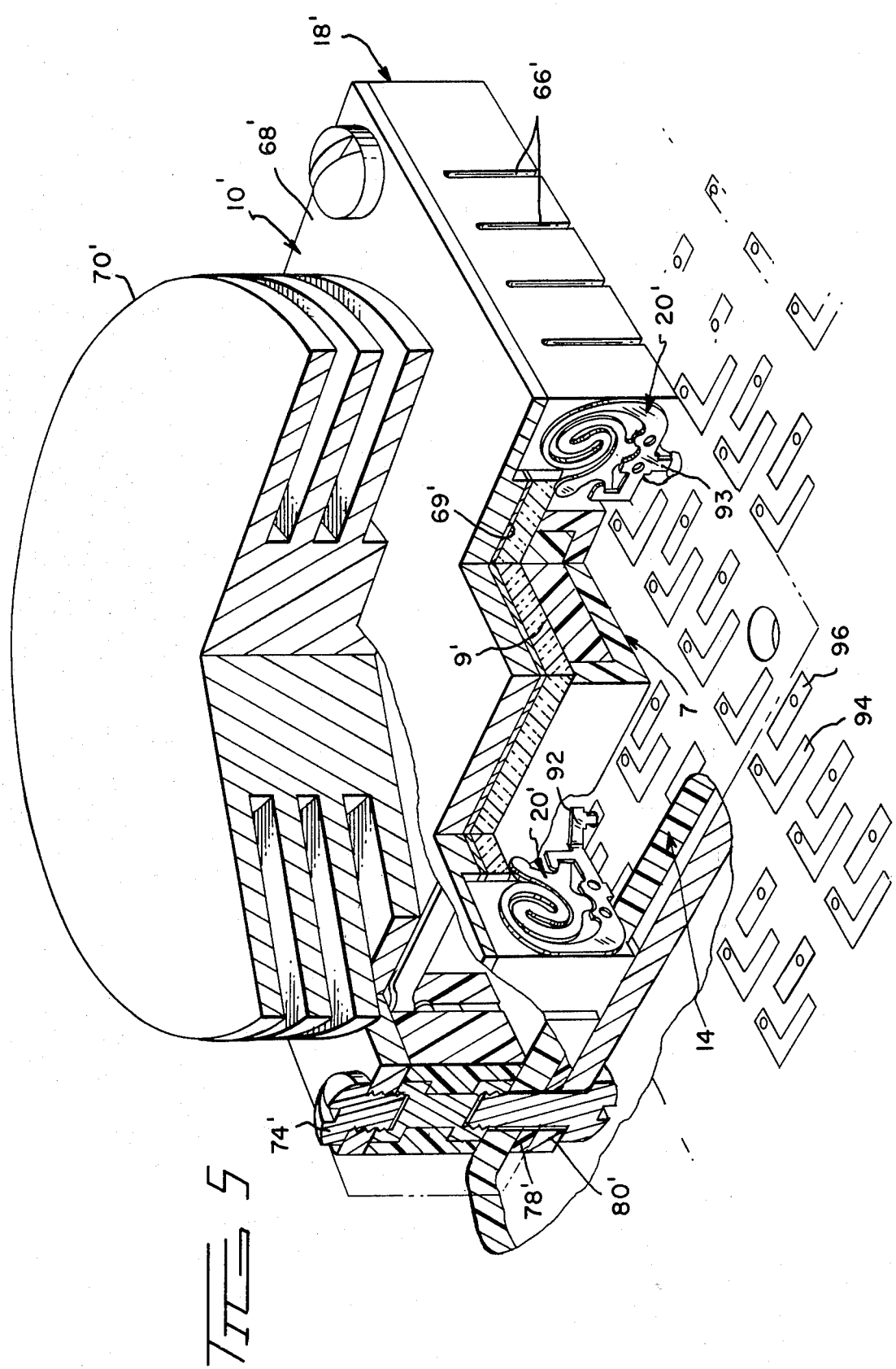

LOW IMPEDANCE ELECTRICAL CONNECTING MEANS FOR SPACED-APART CONDUCTORS

FIELD OF THE INVENTION

This invention relates to electrical connecting means for connecting a first plurality of conductors. The invention is disclosed and described below with particular reference to connectors for connecting conductor pads on an IC chip carrier to conductor pads on a circuit board, however, the principles of the invention can be used under many other circumstances, for example, in connectors for connecting conductors in a first cable to conductors in a second cable.

BACKGROUND OF THE INVENTION

The continuing trend toward reduction in the sizes of micro-electronic devices and towards the provision of increasing numbers of electrical functions on a single integrated circuit chip has required the producers of electrical connectors for connecting conductive pads on chip carriers to conductive pads on circuit boards to correspondingly reduce the size of their connectors. It is, however, always necessary in the design of an electrical connector to provide some minimum contact force at the electrical interfaces between the terminals in the connector and the conductors on the chip carrier and on the circuit board. These contact forces are maintained by providing the terminals in the connector with an integral spring means which forces the contact areas of the terminal against the contact pads on the chip carrier and on the circuit board.

The extremely small size of present day micro-electronic devices and the close spacing of the terminal pads on the chip carrier and on the circuit board necessitates the use of relatively thin metal stock for the terminal in the connector and in order to obtain the required contact forces, designers have increasingly been resorting to the use of terminals having relatively long springs, that is, springs which are part of the terminal and which may extend sinuously from the chip carrier to the circuit board in order to obtain adequate contact forces at a reasonably constant or low spring rate over a relatively wide deflection range. In conventional connectors, the current flowing from the chip carrier to the circuit pad must flow through the spring and because of the length of the spring, self-inductance effects become significant in the connector. The self-inductance in the terminals of the connector give rise to problems, in that it tends to increase the power requirements of the circuit and thereby complicate the heat dissipation and signal propagate problems.

These self-inductance effects are always present in electrical circuits and are often important in conventional solid state micro-electronic circuits containing IC devices with extremely short switching and rise times. The self-inductance effects are particularly significant in circuits operating under cryogenic conditions, such as Josephsen junction devices operating at near zero degrees K. Devices of this type have a switching time on the order of a picosecond. With signals of such short duration, the energy loss which results from even minor self-inductance effects may make the device unusable.

The present invention is directed to the achievement of a connector for connecting first conductors to second conductors which gives the designer freedom to achieve the desired spring characteristics in the terminals of a connector without accompanying self-inductance in the terminals. In accordance with the principles of the invention, each terminal in the connector comprises first and second contact portions which are engageable with a first and second conductor respectively, and which are adjacent to each other. First and second bypass contact surfaces are provided on the contact surfaces and when current flows from the first conductor to the second conductor, it flows from the first conductor to the first contact portion, past the bypass contact surfaces to the second contact portion and then to the second conductor. Contact forces are maintained by an integral spring loop which extends circuitously from the first contact portion to the second contact portion and which, in use, is deflected so that it maintains the necessary contact forces between the conductors and the contact portions of the terminal and at the bypass contact interface. Little, if any, current flows through the spring loop and the inductance effects are thereby minimized or eliminated. The principles of the invention will find application in all circuits in which self-inductance effects may be significant. As mentioned above, the use of the invention is particularly beneficial in circuits having extremely short switching times, such as Josephsen type junction device circuits operating at near zero degrees K.

DESCRIPTION OF THE DRAWINGS

FIG. 4 is a plan view of a terminal in accordance with an alternative embodiment.

FIG. 5 is a perspective view similar to FIG. 1, showing a connector having terminals of the type shown in FIG. 4 thereon.

FIG. 6 is a plan view of a terminal in accordance with a further embodiment.

PRACTICE OF THE INVENTION

Figure 1:
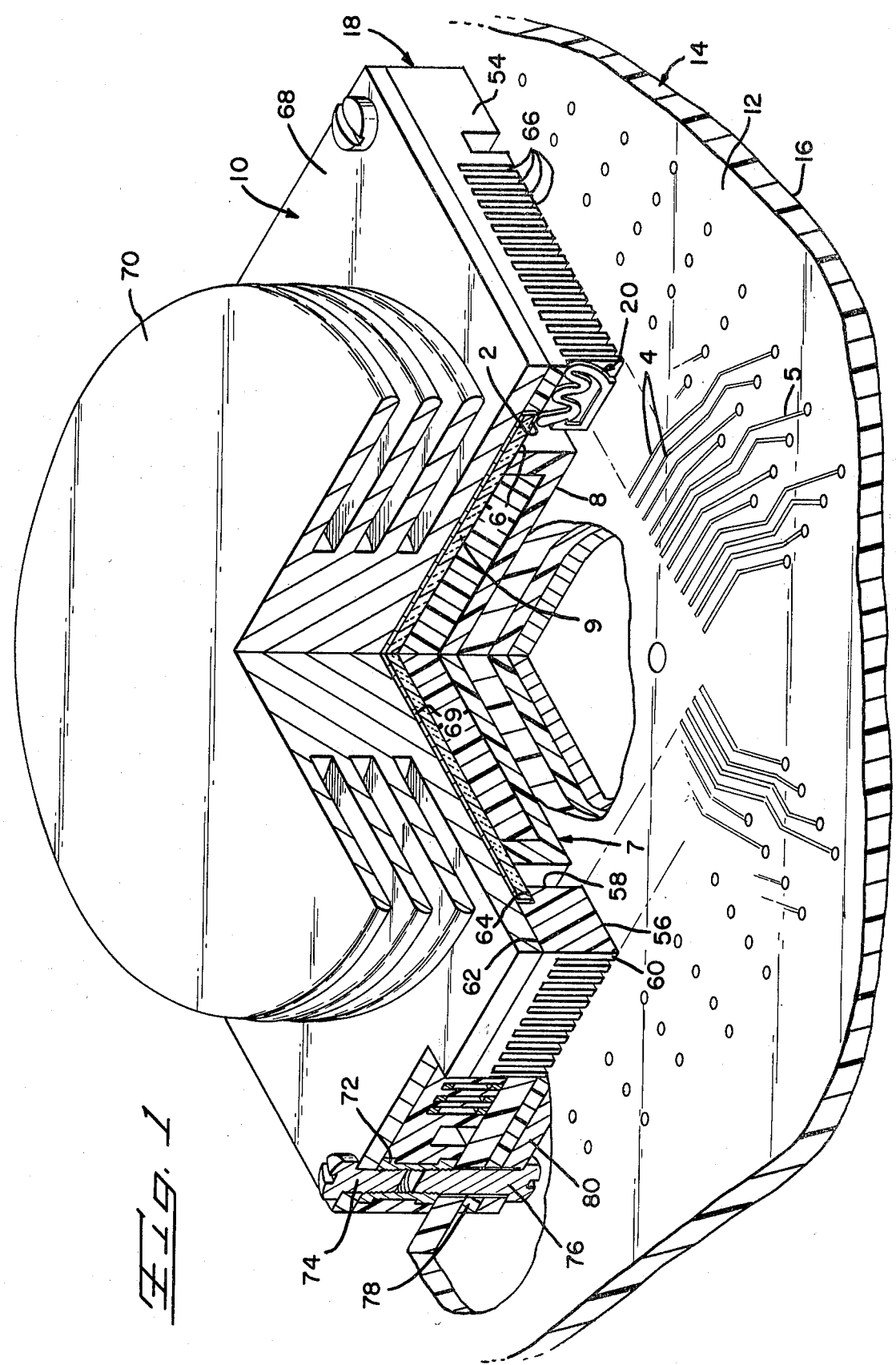
FIG. 1 is a perspective view with parts broken away of a portion of a circuit board having a chip carrier thereon with the conductors of the chip carrier connected to conductors on the circuit board by means of a connector, in accordance with the invention.
Figure 2:
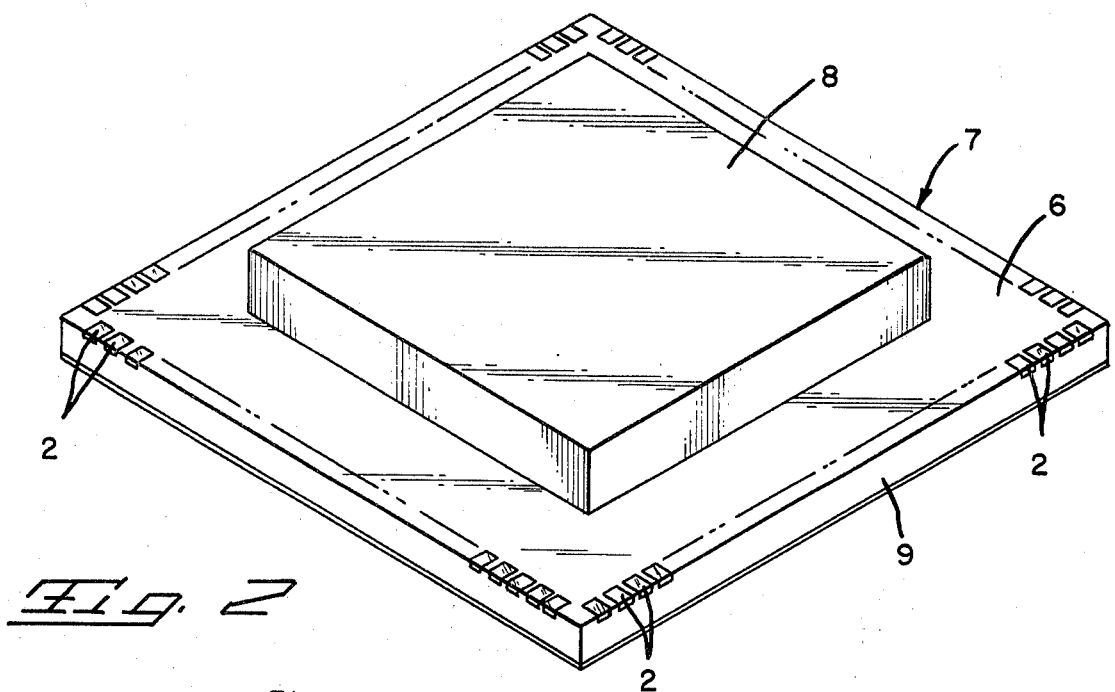
FIG. 2 is a perspective view of the chip carrier.
Figure 3:
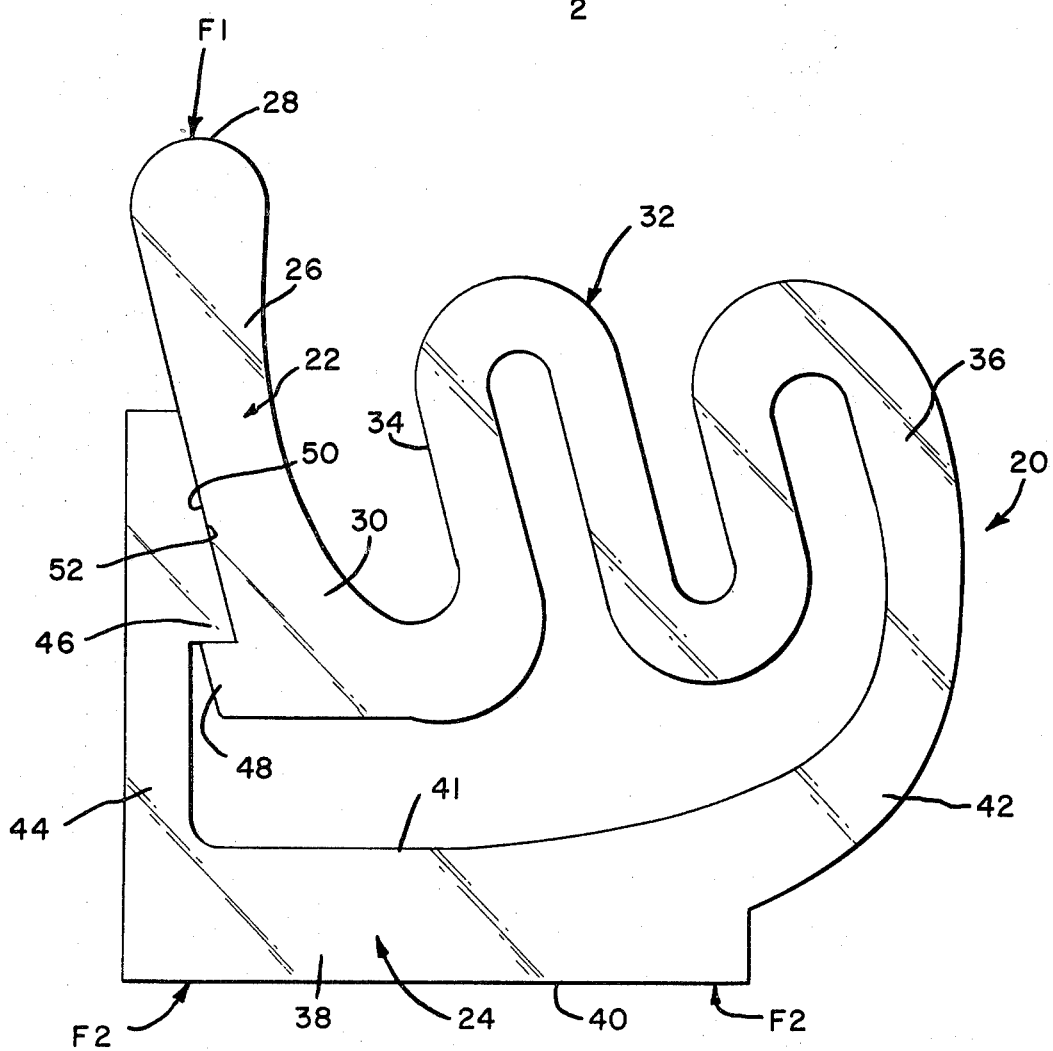
FIG. 3 is a plan view of a terminal of the type used in the connector of FIG. 1.

Referring first to FIGS. 1-3, a connector in accordance with the invention may serve to connect first conductor contact surfaces 2 on one surface 6 of a chip carrier 7 to second conductor contact surfaces 4 on the upper surface 12 of a circuit board 14. The chip carrier 7 has encapsulated therein an integrated circuit chip and conductors (not specifically shown) extend from the zone 8, in which the chip is encapsulated, through the substrate 9 to the edges of the substrate and to the previously identified first contact surfaces 2, which are arranged along each edge of the substrate. The second conductor contact surfaces 4 are arranged in four rows which form a square and extend outwardly to conductors 5 on the surface 12. The conductors 5 may extend, in turn, to holes in the circuit board which electrically extend to conductors on the underside 16 of the board.

Chip carriers of the type shown in FIG. 2 are made in several sizes and have varying numbers of pads 2 along their edges; some chip carriers having 68 or 136 terminal pads. The spacing between adjacent terminal pads 2 on chips having the maximum number of terminal pads is as low as 0.02" and connectors, in accordance with the invention, are capable of providing connections between chip carriers of this type and the conductors on the circuit on a circuit board.

The connector assembly comprises an insulating housing 18, which may be of suitable plastic material and which is in the form of an open square frame and has a plurality of individual terminals, as shown at 20 therein. A single terminal 20 will be described with reference to FIG. 3 and further details of the connector will be described subsequently.

The terminal 20 (FIG. 3) is stamped from conductive material, such as beryllium copper or phosphor bronze and comprises first and second contact portions 22, 24 which are immediately adjacent to each other at the left hand end of the terminal as viewed in FIG. 3. By virtue of the fact that the terminal is stamped from sheet metal, all parts of the terminal lie in a single plane, the plane of the material from which the terminal was stamped. The terminal is used in an edgewise orientation, as will be explained more fully below. The first contact portion 22 has a knob-like upper end 26, the rounded upper edge 28 of which functions as a first terminal contact surface. The lower portion 30 of first contact portion 22 is integral with a spring loop 32 which, in the embodiment of FIG. 3, comprises two sinuous sections 34, 36 which are inclined leftwardly towards contact portion 22 and which extend beside an edge 41 of contact portion 24.

The second contact portion 24 has a straight base 38, the lower edge 40 of which serves as a second terminal contact surface and this straight portion is connected to the sinuous section 36 by a transition section 42. An arm 44 extends upwardly from the left hand end of base 38 and has a barb-like free upper end 46. The first contact portion 22 has a projection 48 which extends below the barb section 46 and serves as a positioning means and stop for preventing upward movement of the first contact portion beyond the position shown.

The leftwardly facing side edge 50 of first contact portion 22 functions as a first bypass contact surface and the rightwardly facing inclined edge 52 of the barb-like upper end 46 of arm 44 functions as a second bypass contact surface. These bypass contact surfaces are normally against each other as shown, and will move relative to each other when the terminal is put to use as described below.

When the terminal 20 is placed in service, contact forces are applied, as shown at $F_1$ and $F_2$ to the first and second contact surfaces respectively, and the first contact portion moves relatively downwardly with respect to the second contact portion 24. The spring loop 32 is deflected upon application of the forces $F_1$, $F_2$ and thereby maintains the contact surface 28 against a complementary contact surface and the contact surface 40 against complementary contact surface. Furthermore, and during downwardly movement of contact portion 22, the inclined surfaces 50, 52 serve as a camming means and cause a slight lateral motion of the contact surface 28 so that it wipes over the complementary contact surface thereby to break through superficial films and establish a low resistance stable contact.

During use of the terminal, the deflected spring loop means 32 will maintain contact forces at all of the contact interfaces, however, the current flowing from contact surface 28 to contact surface 40 will flow through the interface of the bypass contact surfaces 50, 52, rather than through the spring loop. It is thus apparent that inductance effects in the terminal will be held to an absolute minimum, since the current path from surface 28 to contact surface 40 is as short as it can possibly be. In effect, the mechanical functioning of the terminal, the operation of the spring means to maintain contact forces, is separated from the electrical function and the spring means can therefore be designed to obtain optimum force characteristics without regard to accompanying self-inductance problems.

In the event that there is a small flow of current through the spring means, because of the construction resistance of the electrical interface 50, 52, the very minor self-inductance effects produced can also be minimized by the use of a terminal, as shown in FIG. 4 and as will be described below.

The connector housing 18 comprises a molded open square frame, each section 54 of which has a rectangular cross section having a base 56 which is against the surface 12 of the circuit board 14, outwardly and inwardly facing side surfaces 60, 58, and a top surface 62, the top and inwardly facing side surfaces being recessed, as shown at 64, to provide a ledge upon which the marginal edge portions of the substrate 9 are supported. A plurality of terminal-receiving cavities 66 in the form of narrow slots extend inwardly from the bottom surface 56 and the side surfaces 58, 60. These slots having a width only slightly greater than the thickness of an individual terminal 20 so that the terminals will be supported against buckling in the slots, but the spring loops will be free to deform. The end portions 26 of the first contact portions of the terminals extend into the recess in the top and side surfaces 58, 62 so that the first contact surfaces 28 are exposed and the second contact surfaces 40 are normally disposed below the bottom surface 56. These surfaces move relatively towards each other when the connector is placed in service, as described below.

The connector 18 is mounted on the circuit board 14 by means of fasteners 76 which extend through holes in the circuit board from the underside thereof and are threaded into metallic threaded inserts 72 in the corners of the connector housing. An insulating plate 78 is placed beneath the connector on the underside 16 of the board and a metallic plate is disposed against the surface of the insulating plate 78. The metallic plate 80 stiffens and supports the circuit board in the vicinity in which the connector is clamped to the board and the insulating plate 76 insulates conductors on the underside of the board from the plate 80.

The cover and heat sink 10 comprises a square metallic plate which is also clamped to the upper surface 62 of the housing by means of fasteners 74 threaded into the inserts 76. The surface of the substrate 9, which is adjacent to the heat sink 10, is preferably metallized with a very thin metallic coating and a thin metallic plate 69 is located against this surface and between the substrate and the lower surface of the plate portion 68 of the heat sink 10. The plate 69 is advantageously of a relatively soft conductive metal such as indium, so that when the heat sink plate is clamped against the upper surface 62 of the connector, the soft metallic plate will be deformed and will be pressed into intimate contact with the substrate and with the surface of the heat sink plate. The surfaces of plate 69 will then conform to the adjacent surfaces thereby to facilitate transfer of heat to the heat sink. The upper surface of the heat sink plate 68 is provided with fins 70 which facilitate the removal of heat by radiation.

The connector and the chip carrier 7 are assembled to the circuit board 14 by means of the fasteners 76. Thereafter, the chip carrier 7 is positioned in the central opening of the connector housing 18 so that the conductor surfaces 2 on the substrate are against the first contact surfaces 28 of the individual terminals. The heat sink 10 is then assembled to the upper surface of the connector housing and the fasteners 74 are tightened to draw the heat sink against the surface 62. Tightening of the fasteners 74 has an effect of pressing the substrate against the contact surfaces 28, thereby developing the contact forces between the conductor contact surfaces and the terminal contact surfaces 2, 28, and 4, 40. The spring 32 is deflected and maintains these contact forces as well as the contact forces at the bypass interface 50, 52 of each terminal. When the connector is assembled to the circuit board, the contact surfaces 40 are substantially coplanar with the lower side 56 of the connector housing.

Connectors in accordance with the invention can be made in any desired size but the advantages of the invention are particularly important in the case of chip carriers having high count conductor pads 2 on their substrates, since the pads are closely spaced and the terminals in the connectors must be spaced with an equal degree of closeness. Terminals in accordance with the invention can, for example, be manufactured from stock metal having a thickness of about 0.008 to 0.010" and can be used in a connector designed for use with terminal pads having a center-to-center spacing of 0.02".

FIG. 4 shows an alternative terminal in accordance with the invention and FIG. 5 illustrates the use of this terminal in a modified connector housing. The terminal 20' of FIG. 4 has many of the features, in slightly modified form, of the previously described terminal and the same reference numerals, differentiated by prime marks, are used to indicate corresponding structural features of the terminals 20 and 20'. The terminal 20' has a spiral spring loop means 32' comprising first and second convolutions 82, 84 which extend from the geometric center 86 of the spiral. This spring arrangement will provide for a relatively large displacement of the first contact portion 22' towards the second contact portion 24' and will maintain an almost constant spring rate over this large displacement range. There is always some slight constriction resistance at the bypass contact surfaces 50', 52', in FIG. 4, and a very small current may flow through the spring loop. If the inductance effects from even this very small current are objectionable, they can be minimized by the use of spiral type spring means of the type shown in FIG. 4 because of the fact that the oppositely extending convolutions 82, 84 will have the effect of cancelling any small self-inductance which arises in the spring system.

The terminal of FIG. 4 has a semi-circular projection 50' at the transition section between the first contact portion 22' and the spring loop 32' and this projection is received in a complementary semi-circular notch 52' in the second contact portion 24'. The edges of the projection and the notch 50', 52' serves as the bypass contact surfaces and in addition, this arrangement provides a pivotal action of the contact portion 22' when the load is applied to the contact surfaces 28', 40'. This pivoting effect further contributes to the attainment of a substantially constant spring rate in the terminal so that the terminal is extremely tolerant of wide variations in the distance separating the surface of the circuit board and the terminal pads on the substrate.

The connector shown in FIG. 5 containing terminals of the type shown at 32' is similar in many respects to the connector shown in FIG. 1 and need not be described in detail. FIG. 5 also shows an alternative form of conductor pads 94, 96 on the circuit board and illustrates that more than one conductor pad 94, 96 can be contacted by an individual terminal. Also, an extra arm, shown at 92, can be provided on the terminal having a projection on its end which is received in a hole on the circuit board so that direct connection can be made to a conductor on the underside of the circuit board. Alternatively, the projection can extend directly from the section 38' as shown at 93.

FIG. 6 shows an extremely simple form of terminal in accordance with the invention in which the spring loop 32" is substantially circular but with the width of the spring decreasing with increasing distance from the second contact portion 24" to the first contact portion 22". Both embodiments, as shown in FIGS. 4 and 6, have camming means or camming surfaces at the bypass contact surfaces to cause lateral movement, a so-called "contact wipe", of the first terminal contact surface over the pad surface.

While all of the embodiments of the invention disclosed in the drawing are intended for use with integrated circuit packages for connecting substrate conductors to circuit board conductors, the principles of the invention can be used under a variety of other conditions. For example, inductance effects can become significant and troublesome in connectors which connect conductors in a first conductor cable to conductors in a second flat conductor cable. Connectors of this class must also have terminals which have spring means for maintaining contact forces at the terminal-cable conductor interfaces and the terminals used frequently have relatively long springs in order to achieve the required contact forces. The inductance effects arise in these springs and they can be minimized by the use of terminals having bypass contacts for the current, as discussed above.

As mentioned previously, the principles of the invention are particularly important in circuits having extremely short switching times, such as circuits having Josephsen junction devices in which the switching times are of the order of a picosecond. Devices of this type can be used at temperatures close to 0° K., with metals which are superconductive at these temperatures. When the principles of the invention are practiced under these conditions, it is desirable to plate the terminals with a metal which exhibits superconductivity at extremely low temperatures, such as niobium-tin alloys, tin, and indium, among others.

I claim:

1. A multi-contact electrical connector for electrically connecting a first plurality of electrical conductors to a second plurality of electrical conductors with individual conductor-to-conductor connections, said first plurality of conductors having spaced-apart side-by-side first conductor contact surfaces, said second plurality of conductors having spaced-apart side-by-side second conductor contact surfaces, said first conductor contact surfaces being opposed to, and spaced from, said second conductor contact surfaces, said electrical connector comprising:

a plurality of flat stamped one-piece contact terminals of conductive resilient metal, each of said terminals having all parts thereof lying in a single plane and having first and second contact portions which are adjacent to each other, first and second terminal contact surfaces on said first and second contact portions respectively, said terminal contact surfaces facing in opposite directions, first and second bypass contact surfaces on said first and second contact portions respectively, said first and second bypass contact surfaces facing each other, said first and second terminal contact surfaces being remote from each other and said first and second bypass contact surfaces being proximate to each other, said bypass contact surfaces being between said first and second terminal contact surfaces, each of said terminals having integral spring loop means extending circuitously and laterally between said first and second contact portions, said loop means being resiliently deformable upon movement of said first and second contact portions relatively towards each other, said first and second bypass contact surfaces being movable against, and relatively over, each other upon movement of said first and second contact portions relatively towards each other, housing means for said terminals, said housing means having a plurality of side-by-side terminal-receiving cavities, each of said terminals being received in one of said cavities with said terminal contact surfaces of each terminal being normally disposed outside of said housing means, said cavities comprising narrow slots which support said terminals against buckling and leave said spring loop means free to deflect along their entire lengths, and conductor supporting and moving means for supporting said first conductor contact surfaces against said first terminal contact surfaces, for supporting said second conductor contact surfaces against said second terminal contact surfaces, for moving said first conductor contact surfaces relatively towards said second conductor contact surfaces, and for holding said conductor contact surfaces in their moved positions whereby, during movement of said conductor contact surfaces towards said second conductor contact surfaces, said loop means will be resiliently deformed and will impose contact forces which will maintain said bypass contact surfaces against each other, which will maintain said first terminal contact surfaces against said first conductor contact surfaces, and which will maintain said second terminal contact surfaces against said second conductor contact surfaces, and said bypass contact surfaces will permit current flowing from each of said first conductors to each of said second conductors electrically to bypass said loop means, thereby to minimize self-inductance in each of said terminals.

2. A multi-contact electrical connector as set forth in claim 1, each of said terminals comprising a base portion, said second contact portion comprising said base portion, said loop means extending beside one edge of said base portion.

3. A multi-contact electrical connector as set forth in claim 2, said base portion being straight, said second terminal contact surface comprising the other edge of said base portion.

4. A multi-contact electrical connector as set forth in claim 3, said base portion having an arm extending from one end thereof towards said first contact portion, said arm having a free end, said second bypass contact surface being on said free end, said first contact portion being against said free end.

5. A multi-contact electrical connector as set forth in claim 4, said loop means of each of said terminals being generally serpentine and extending from the other end of said base portion to said first contact portion.

6. A multi-contact electrical connector as set forth in claim 5, said loop means being sinuous.

7. A multi-contact electrical connector as set forth in either of claims 4 or 5, said loop means of each of said terminals being generally arcuate.

8. A multi-contact electrical connector as set forth in claim 7, said loop means comprising a spiral having at least two arcuate convolutions extending from the center thereof, one of said convolutions extending to said first contact portion and the other one of said convolutions extending to said second contact portion.

* * * * *